United States Patent [19]

Floru et al.

[11] Patent Number: 5,736,846
[45] Date of Patent: Apr. 7, 1998

[54] AC CURRENT SENSOR

[75] Inventors: Fred Floru, Newton; Gary K. Hebert, Shrewsbury, both of Mass.

[73] Assignee: THAT Corporation, Marlborough, Mass.

[21] Appl. No.: 540,045

[22] Filed: Oct. 6, 1995

[51] Int. Cl.$^6$ .......................... G01R 11/48; G01R 19/00
[52] U.S. Cl. ............................................ 324/127; 324/654
[58] Field of Search ................................. 324/654, 726, 324/117 R, 127, 142

[56] References Cited

U.S. PATENT DOCUMENTS

| | | | |
|---|---|---|---|
| 4,491,790 | 1/1985 | Miller | 324/142 |
| 4,511,839 | 4/1985 | Bulaty et al. | 324/127 |
| 4,887,029 | 12/1989 | Hemminger | 324/142 |

*Primary Examiner*—Glenn W. Brown
*Attorney, Agent, or Firm*—Lappin & Kusmer LLP

[57] ABSTRACT

A current sensor for detecting AC current through a load impedance of an electrical circuit. Sensor components are fabricated within a multilayer board so that a board can be made to comprise a plurality of independent sensors. The sensor includes a transformer circuit including a primary coil which is electrically coupled in series with the current path of the electrical circuit. This primary coil includes at least one current path element, in the form of a conductive strip constructed so as to add minimal resistance and inductance to the electrical circuit. The transformer secondary comprises at least a first electrically conductive coil inductively coupled to at least a part of the current path, and preferably a second electrically conductive coil inductively coupled to a second part of current path of the electrical circuit. The secondary coils are electrically connected in series with one another, so that voltages generated across the coils in response to current in the current path are additive, while interference voltages which are induced in the coils by the presence of uniform external magnetic fields or cross talk between adjacent sensors on the same board (where multiple sensors are provided) are cancelled.

17 Claims, 4 Drawing Sheets

AC CURRENT SENSOR

FIELD OF THE INVENTION

The present invention relates to devices for detecting and determining the amplitude of an alternating current (AC) flowing through a load impedance in an electrical circuit.

BACKGROUND OF THE INVENTION

It is often desirable to be able to determine the amplitude of an alternating current flowing through a load impedance in an electrical circuit.

It is well known that an AC current flowing through an electrical conductor produces an alternating magnetic field around the conductor where the flux density decreases with increasing radial distance from the conductor. The instantaneous magnetic field strength is proportional to the instantaneous current amplitude. This magnetic field can be detected by placing an open, electrically conductive loop or coil within the magnetic field. An alternating voltage will be induced across the terminals of the open loop which is proportional to the strength of the magnetic field. To the extent that the magnetic field enclosed by the conductive loop is caused by the current flow through the conductor, the voltage across the terminals of the loop will be proportional to the current in the loop. The current flowing in the conductor may therefore be measured by measuring the voltage across the loop.

The sensitivity of such a current detector may be increased by forming a portion of the conductor as a closely wound coil of one or more turns (the number of turns depending upon the desired sensitivity of the sensor used to sense the field). As is well known, the greater number of turns, the larger the magnetic field created for a given current. As current flows through the turns of the coil, a magnetic field is created which can be detected as previously described.

A disadvantage of forming a portion of the conductor carrying the current being measured into a coil to create the measured magnetic field is that the coil adds additional impedance in the current flow path of the measured current, and thereby affects the phase of the current as well as the value of the current. In many cases it is desirable to measure the current flowing in the load without appreciably affecting that current, which requires that the impedance of the sensor be very small.

Less intrusive devices are known, such as the Hall-effect sensor and toroidal sensing coils, for sensing the current flow through a wire without affecting the current. The toroidal sensing coil, for example, uses a toroidal-shaped magnetic core positioned around the current-carrying conductor for creating a circular path for at least a portion of the magnetic field created around the wire. An open coil is wound around the core for sensing magnetic flux created in the core in response to AC current flowing through the conductor. A voltage is induced across the terminals of the open coil proportional to the current flowing through the wire without affecting that current. Such current sensing devices, however, can be bulky and/or expensive, rendering them unsuitable for use in certain applications, especially in printed circuit boards and other space-constrained applications, or where it is desirable to provide a non-intrusive current sensor.

For example, it may be desirable to monitor AC current flowing through a plurality of channels of a power amplifier used in an emergency warning system of a large building to insure that the system is working properly. In such an emergency warning system, audio messages are transmitted from a central location through multiple channels to a number of loudspeakers at remote locations. If a disruption, such as a fire at one of the locations, occurs, it is beneficial to know that the audio signals are not being transmitted to that location. Because the fidelity of the sound reproduced by a loudspeaker depends on a low-impedance connection between the power amplifier and the loudspeaker, and because audio signals are made up of AC voltages and/or currents, it is therefore desirable to monitor the AC current flow between the power amplifier and each remote location in an inexpensive and nonintrusive way.

OBJECTS OF THE INVENTION

It is therefore an object of the present invention to provide a compact, non-intrusive, highly accurate device for detecting AC current, without significantly affecting the impedance of the current flow path.

It is another object of the invention to provide a current sensor which can be fabricated in an economical manner, such as in a printed circuit board.

And another object of the invention is to provide a current sensor which can be used to detect current having signal energy in, and preferably throughout, the audio frequency range.

Yet another object of the invention is to provide a current sensor which has an inherently low impedance for the measured current passing through the sensor.

Still another object of the invention is to provide a current sensor for measuring the current passing through an electrical circuit substantially independently of frequency.

And yet another object of the invention is to provide a current sensor system including a plurality of such sensors constructed on a multi-layer board so that cross talk between the sensors is substantially minimized or eliminated.

SUMMARY OF THE INVENTION

The invention provides, in accordance with one aspect, a non-intrusive current sensor for detecting current provided to a load impedance of an electrical circuit without appreciably affecting the load. The circuit includes a source of electrical power, and a current path for conducting current between the power source and the load impedance. The sensor preferably includes:

- at least one current element, forming a part of a current path, for connecting the sensor to the load impedance of the electrical circuit so as to form a primary coil of a transformer circuit;
- at least one secondary coil of the transformer circuit, positioned so as to be closely magnetically coupled to the primary coil near the current path element; and
- a pair of output terminals coupled to said secondary coil for providing an output signal representative of the current through a load impedance in response to current flowing through the current path element;

wherein the current path element is a segment of electrically-conductive material coupled in series with the source and the load impedance constructed so as to minimize the resistance and inductance added by the sensor to said electrical circuit.

In accordance with another aspect of the present invention, component parts of the sensor are made in a multi-layer board.

In accordance with another aspect of the present invention, means are provided for cancelling interference signals induced in the sensor by uniform external fields.

In accordance with another aspect of the present invention, components of multiple sensors are provided on the same multi-layer board, and means are provided for cancelling interference signals induced in each sensor by cross talk from the fields created by the other sensors.

These and other objects and advantages of the invention will in part be obvious and will in part appear hereinafter. The invention accordingly comprises the apparatus possessing the construction, combination of elements and arrangement of parts which are exemplified in the following detailed disclosure, the scope of which will be indicated in the claims.

BRIEF DESCRIPTION OF THE DRAWINGS

For a fuller understanding of the nature and objects of the present invention, reference should be had to the following detailed description taken in connection with the accompanying drawings, in which.

DETAILED DESCRIPTION OF THE DRAWINGS

The current sensor of the present invention is constructed as part of a multi-layer board, preferably using printed circuit board (PCB) technology. Printed circuit board technology enables the basic component parts of the current sensor to be fabricated as part of and integral with the board and thus substantially reduces the cost of the circuit and of the sensor components, and can provide for a non-intrusive device. In this way, component parts of multiple sensors can be incorporated in a single board for respectively connecting multiple audio channels, for example, to multiple loudspeakers at remote sites.

Figure 1:
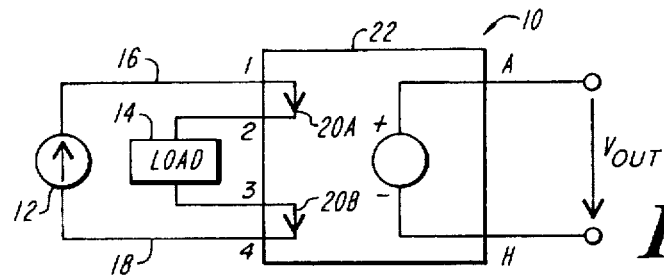
FIG. 1 is a simplified schematic diagram of an electrical circuit employing the current sensor of the present invention.

As shown schematically in FIG. 1, an electrical circuit 10 employing the current sensor of the present invention includes a source of electrical power 12, a load impedance 14, and a current path, indicated 16 and 18 connecting the two together. The current path, indicated by 16 and 18, connects the power source to the load. As will be more evident hereinafter, the electrical circuit provides a loop which carries the current and functions as the primary of a coreless transformer which forms at least a part of the sensor when in use.

Electrical current flow in this primary loop creates at least one magnetic field (described hereinafter) which extends concentrically around the current path. In accordance with the present invention, at least one portion, and preferably two portions, of the current path of the primary pass through a part of a connector board 22 as respectively indicated current path elements at 20A and 20B of FIG. 1.

Although a single current path element of the primary is sufficient to achieve the objectives of the invention, preferably two or more current path elements are used in conjunction with a plurality of secondary sensor coils in order to increase the output of the sensor, as will be more evident hereinafter.

The current sensor of the present invention operates on the basis of the observable phenomenon that placement of an open loop of an electrical conductor within a magnetic field generated by the flow of alternating current induces a voltage at the terminals of the loop in response to the AC current flow. The preferred current sensor operates by measuring voltages induced in one or more electrically conductive secondary coils which are inductively coupled to the current path elements of the primary, as indicated in FIG. 1. The secondary coils of each sensor are thus placed within the locus of the magnetic field which is established during AC current flow through the current path elements 20A and 20B of the electrical circuit. The coils of the sensor are configured in such a manner that substantially all voltages which are induced in the secondary coils of a sensor as a result of AC current flow through the respective current path elements 20A and 20B of the electrical circuit are additive. The sum of the induced voltages is representative of, and proportional to, the magnitude of the current flowing through the load impedance.

Figure 2A:
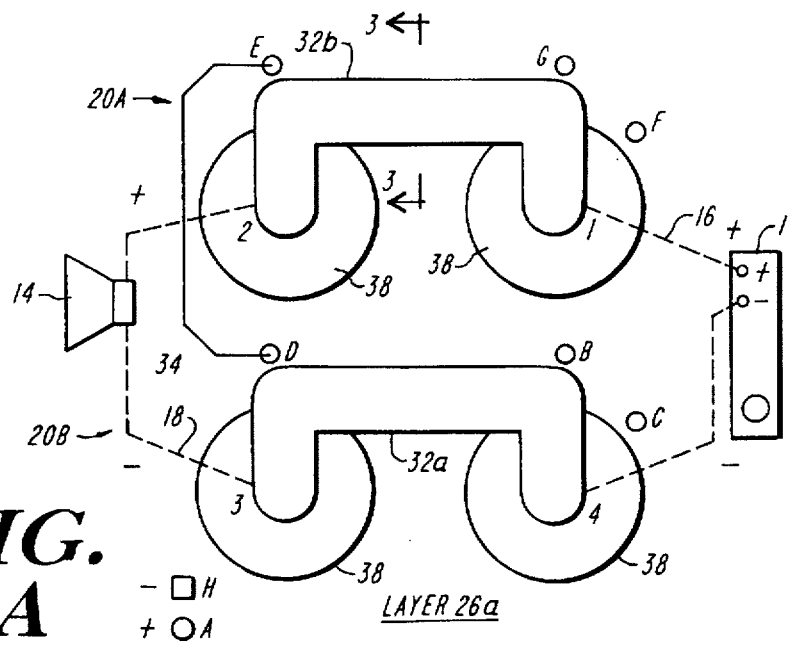
FIG. 2A is a plan view of a primary layer of a multilayer connector board defining two current paths as a part of the preferred current sensor of the present invention and shown connected to a power source and a load.
Figure 2B:
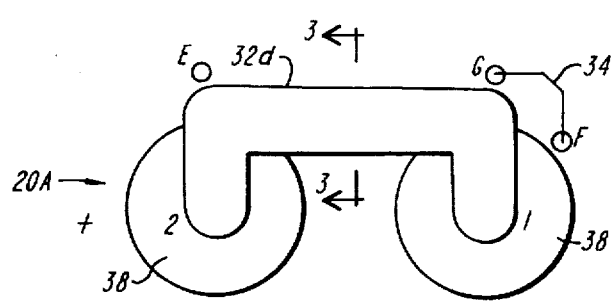
FIG. 2B is a plan view of another primary layer of the multilayer connector board of FIG. 2A and defining two current paths as a part of the preferred current sensor of the present invention.
Figure 2B:
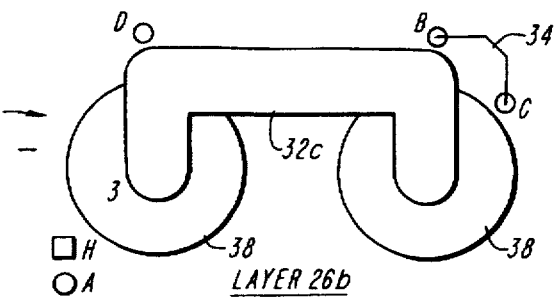
Figure 2C:
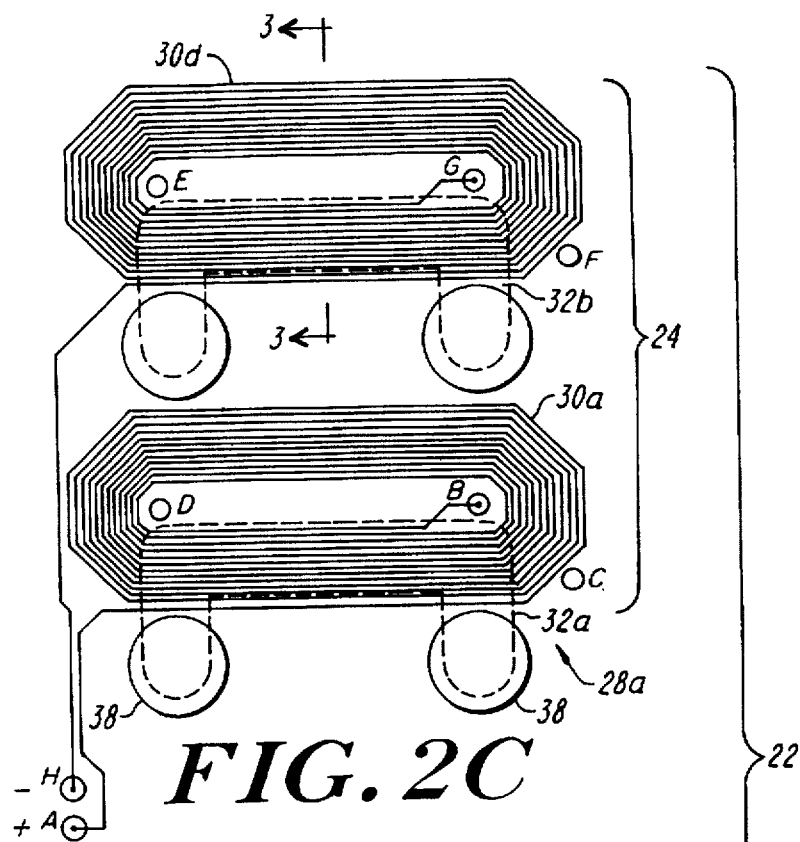
FIG. 2C is a plan view of a secondary layer of the multilayer connector board in which a pair of current sensor coils is disposed respectively within the magnetic fields created by the AC current flowing through the current paths of the primary layer of the connector board shown in FIG. 2A.
Figure 2D:
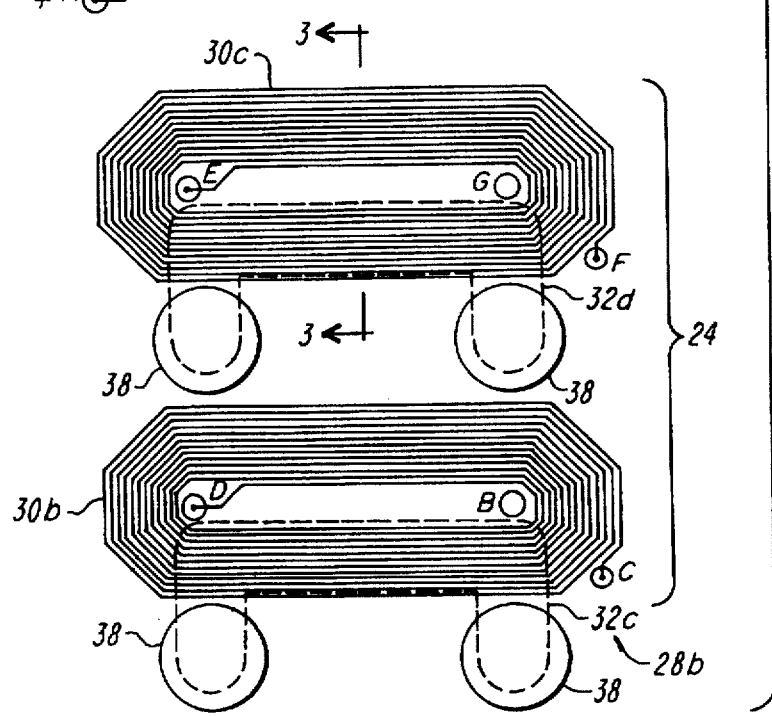
FIG. 2D is a plan view of another secondary layer of the multilayer connector board in which another pair of current sensor coils is disposed respectively within the magnetic fields created by the AC current flowing through the current paths of the primary layer of the connector board shown in FIG. 2B.
Figure 3:
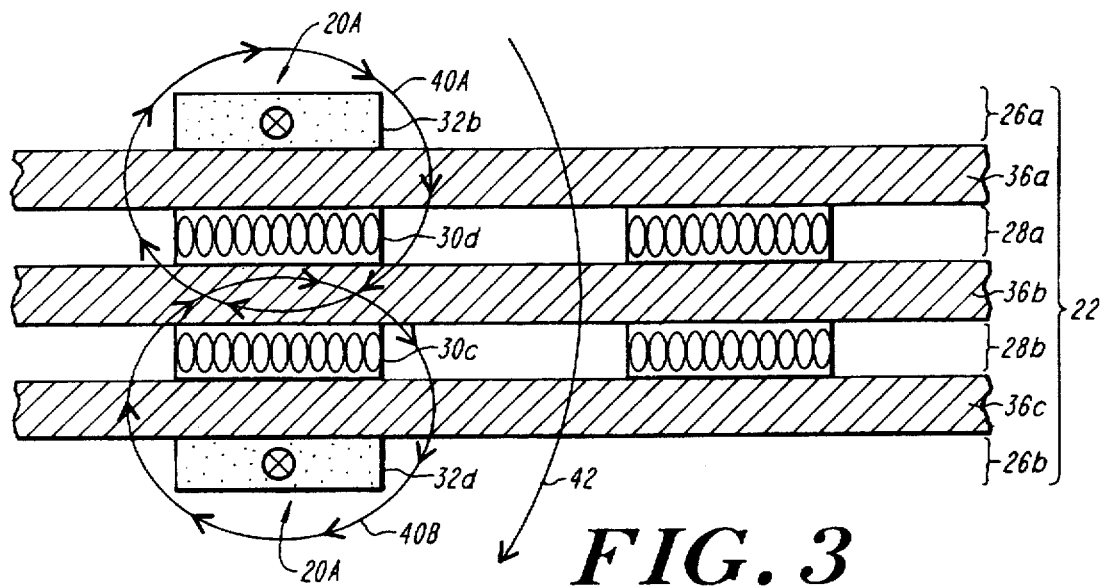
FIG. 3 is a cross-sectional view, taken through section lines 3—3 of FIGS. 2A–2D, of a connector board in which a multilayer electrical circuit employing the current sensor of the present invention is fabricated.

FIGS. 2A–2D and FIG. 3 illustrate a preferred embodiment of the multi-layer board 22 employing at least one current sensor 24 according to the present invention. FIGS. 2A and 2B illustrate, respectively, the top view of the primary layers 26a, 26b of the conductive material of the multi-layer board. These primary layers include, respectively, the component and wire connections for the sensor, which form the current path elements 20A and 20B of the primary coil of the transformer, and which can be formed, for example, by etching and/or plating the conductive layers. FIGS. 2C and 2D, in contrast, illustrate secondary layers 28a, 28b of the conductive material of the multi-layer board, each of which includes one or more secondary current sensor coils 30 of the transformer and which can also be formed, for example, by etching and/or plating the layers of conductive material. FIG. 3 illustrates the side view of the preferred embodiment of the multilayer connector board 22.

Referring now to FIG. 1, AC current flows between the power source 12 and the load 14, through both current path elements 20A and 20B. As shown in FIGS. 2A and 2B, in the preferred embodiment, each of the current path elements 20A and 20B is defined by a relatively wide electrically conductive strip 32 in each of the primary layers 26a, 26b of the conductive material, electrically connected at opposite ends, respectively, to two electrically conductive connectors, indicated at 38, for receiving connecting pins, wires or similar devices for electrically connecting external components together through the board in accordance with the present invention. Each of these wide conductive strips 32 provides a relatively low impedance path for the current flowing through the circuit and thus has minimal effect on the phase or amplitude of the current flowing through it. As shown, for reasons which will be understood hereinafter, the element 20B includes conductive strips 32a and 32c connected at opposite ends to the same connectors 38 so as to form two parallel paths for the current. Similarly, the element 20A includes two conductive strips 32b and 32d connected at opposite ends to the same connectors 38 so as to form two parallel paths for the current passing through that element. It should be noted, however, that while each current path element includes multiple current paths for providing greater sensitivity, a single current path is sufficient to obtain the objectives of the present invention.

Although FIGS. 2A–2D are illustrated separately, they should be viewed as superimposed on one another, as best seen in FIG. 3, with the primary circuit layer 26a, illustrated in FIG. 2A, on top and the primary circuit layer 26b, illustrated in FIG. 2B, on the bottom. The secondary circuit layers 28a, 28b, illustrated respectively in FIGS. 2C and 2D, are sandwiched between the primary circuit layers.

Figure 4:
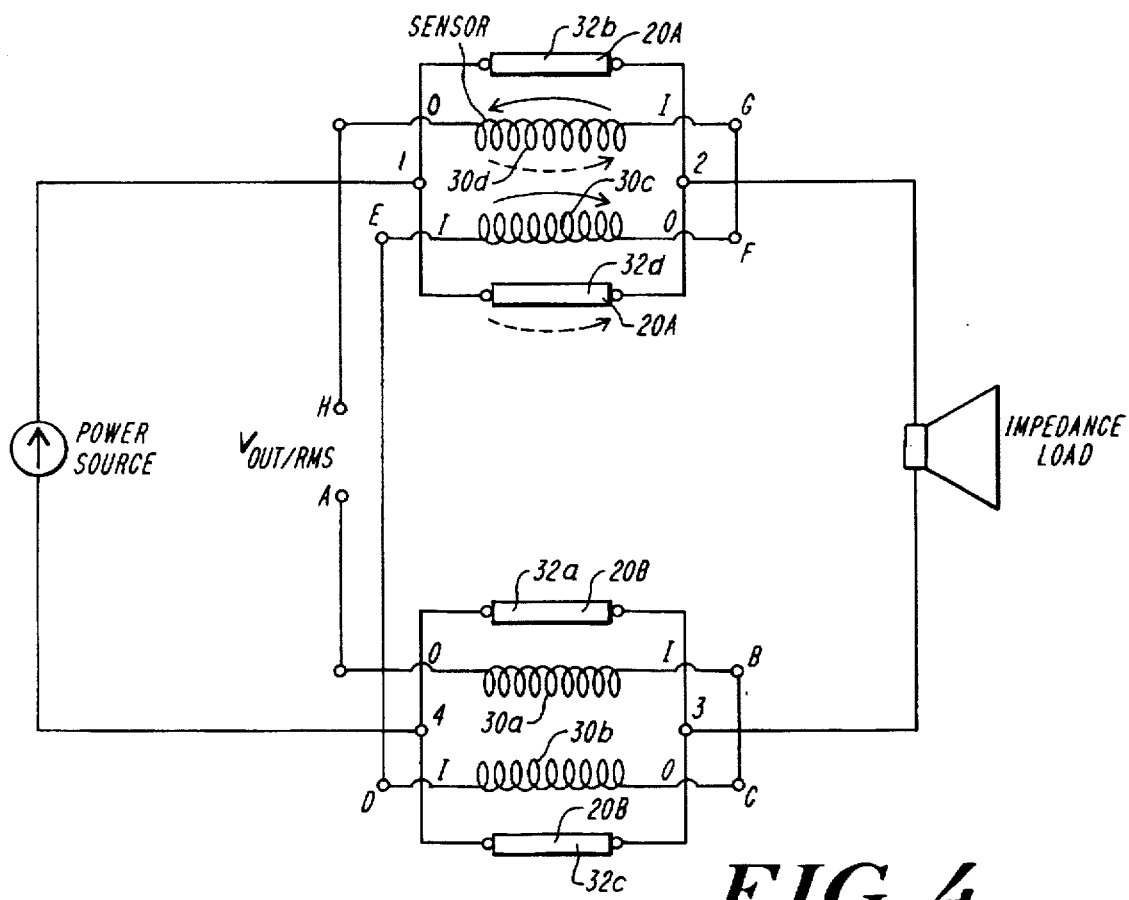
FIG. 4 is a simplified schematic diagram of the circuit of FIG. 1 showing details of the interconnections of the various parts of the sensor.

For ease in understanding the circuit connections, primary connections 1, 2, 3 and 4, and terminals A–H, are labeled on FIGS. 2A–2D, and the connections of the component parts of the sensor are shown in FIG. 4. The inside terminal of each coil 30 is indicated by an "I", while the outside terminal is indicated with an "O". As shown in the schematic diagram of FIG. 4, junction A–H is the output terminal from which measurement of the total induced voltage across the sensor coils 30 can be made. A first current sensor coil 30a is located between terminals A and B. This sensor coil 30a is inductively coupled tightly to the conductive strips 32a and 32c. In the illustrated embodiment, a second current sensor coil 30b is located between terminals C and D. This sensor coil 30b is inductively coupled tightly to the conductive strips 32a and 32c and is electrically connected in series with the current sensor coil 30a, with the inside terminal "I" of coil 30a being connected to the outside terminal "O" of coil 30b.

A third current sensor coil 30c is located between terminals E and F. This sensor coil 30c is inductively coupled tightly to the conductive strips 32b and 32d and is electrically connected in series with the first set of coils 30a, 30b. In the illustrated embodiment, a fourth current sensor coil 30d is located between terminals G and H. This sensor coil 30d is also inductively coupled tightly to the conductive strips 32b and 32d and is electrically connected in series with the current sensor coil 30c, with the outside terminal "O" of coil 30c being connected to the inside terminal "I" of coil 30d.

Junctions B–C, D–E and F–G are electrical connections, indicated at 34 in FIGS. 2A and 2B, between the respective sensor coils 30a–d. The electrical connections are located on the primary circuit layers 26a, 26b, as shown in FIGS. 2A and 2B, and can be formed, for example, by etching and/or by plating. They serve the useful purpose of linking the sensor coils 30a–d in the secondary circuit layers with one another.

It is important to recognize that the secondary sensor coils 30 are not electrically connected to the primary electrical circuit comprising the power source 12, the load 14 and the current path, indicated by 16 and 18. They are only inductively coupled to the current path so that they can detect the magnetic field which is created around the current path elements 20A and 20B during current flow. These coils therefore have little or no effect on the impedance of the circuit. On the other hand, with the current path elements of the circuit forming the primary of a coreless transformer, the open loop formed by the connections made from terminal A through terminal H, wherein the four coils 32 are connected in series, form the secondary of that transformer.

FIG. 3 is a sectional view of four layers of a multilayer connector board and shows one current path element 20A and the associated coils of a current sensor. It will be understood that element 20B and the associated coils will be substantially identical. Each circuit layer is preferably separated by a layer of electrically insulating material 36. The top primary circuit layer 26a includes the conductive strip 32b which is formed directly onto a layer of insulating material 36a. A secondary circuit layer 28a beneath the insulating layer 36a includes sensor coil 30d which is inductively coupled tightly to the conductive strips 32b and 32d. The sensor coil 30d is formed directly onto another layer of insulating material 36b which separates the coil from the current paths and from additional sensor coils which may be included in the circuit. In the illustrated embodiment, another secondary circuit layer 28b lies beneath insulating layer 36b and includes the additional sensor coil 30c which is electrically connected in series with the sensor coil 30d in the preceding secondary circuit layer. As in the preceding secondary layer, sensor coil 30c is inductively coupled tightly to the conductive strips 32b and 32d. The sensor coil 30c is formed directly onto a layer of insulating material 36c. Additional secondary circuit layers including additional sensor coils can be incorporated into the multilayer connector board between the primary circuit layers. Finally, the bottom layer 26b includes conductive strip 32d which, together with conductive strip 32b, defines the current path element 20A. Soldered electrical connections between the leads of the electronic components and the plated through holes 38 of the connector board are made at primary layers 26a and 26b.

Each electrically conductive coil 30 constitutes a coil of the open loop transformer secondary. A voltage is produced across each coil in response to a magnetic field created due to alternating current flow through the corresponding conductive strip 32 and through any additional conductive strips spaced further away from the coil. At least one coil is located near each conductive strip 32 in the current paths of the circuit. The coil near each conductive strip is inductively coupled tightly to the current path defined by the strip, yet is inductively coupled somewhat more loosely to other current paths defined by other conductive strips in the same circuit. In other words, the coils lie within the locus of the magnetic field which is created during current flow through the strip or strips. In this regard, as best seen in FIGS. 2A–2D and FIG. 3, each coil is preferably formed in a somewhat rectangular shape so that the opening of the coil has a long length and a narrow width. In addition, the conductive strip or strips to which it is coupled is disposed above or below the coil directly vertically aligned with the longer side of the coil. The longer length of the opening allows for interception of a larger portion of the magnetic field 40A (seen in FIG. 3) that is created around the conductive strip 32 when current passes therethrough.

The coils 30a, 30b, 30c and 30d are configured in such a way that all the voltages induced in the coils as a result of current flow in the current paths to which the secondary coils are inductively coupled to any extent are additive. Specifically, as shown in FIG. 3, the flux line 40A is created by the field caused by current flowing through the conductive strip 32b, and the flux line 40B is created by the field caused by current flowing through conductive strip 32d. Both are shown as extending in a clockwise direction in FIG. 3 (i.e., when current is flowing in the strips in a direction into the plane of the FIGURE). The voltages created across the two coils will therefore be of the same polarity. With coils 30c and 30d connected so that the outside terminal of coil 30c is connected at F to the inside terminal of coil 30d, the two coil voltages will be additive. A similar effect is created by the same current flowing through conductive strips 32a and 32c, so that the voltages across all four secondary coils will be additive. The resulting induced voltage in the sensor coils is representative of the magnitude of the current flowing through the load and can be calculated for each loop of each sensor coil, according to the following equation:

$$V_{out} = Ef(\mu l I_o)/2\sqrt{2}W) \quad (1)$$

In this equation,

E is a constant whose value depends on the geometry of the primary conductive paths and the sensor coils, as well as their spatial relationships to one another;

$V_{out}$ is the instantaneous value of the induced voltage in each loop of a sensor coil;

μ is the magnetic permeability of the medium through which the magnetic field is established;

l is the length of the current path through which current is flowing (and also the length of one electrically conductive loop forming a part of the sensor coil);

$I_o$ is the peak current through the load impedance;

W is the width of the current path; and f is the frequency of the alternating current in Hertz (Hz).

It should be appreciated that the sensor provides an instantaneous voltage output representative of the instantaneous current flowing through the current path. One can easily measure other values of the voltage, such as the average voltage (i.e., the rms value of the voltage), or the peak voltage from the measurement of the instantaneous voltage.

Figure 5:
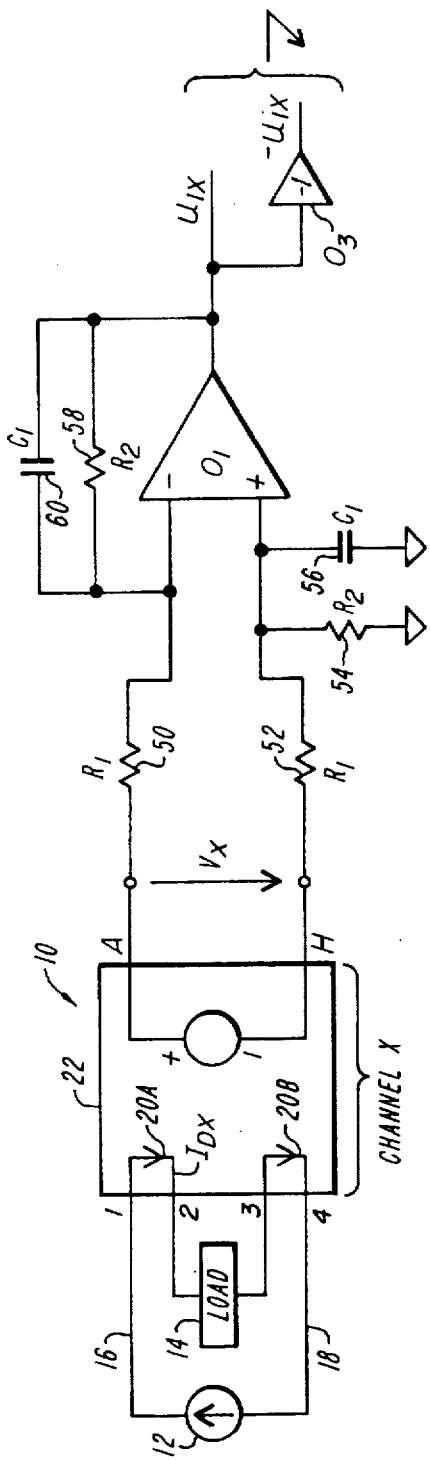
FIG. 5 is a simplified schematic diagram of the circuit of FIG. 1, including additional circuitry for eliminating the frequency dependence of the output signal of the output of the secondary coils of the current sensor.

The sensor of the present invention has a frequency response which increases in proportion with increasing frequency. At extremely high frequencies, e.g., between 80 MHz and 120 MHz, at which PCB transformers have been used with radio frequency circuits, wherein the ratio of the highest to lowest frequency is fairly small (in the example, 1.5:1), frequency dependence may not be that critical. But at relatively low frequencies, such as those found in the audio range (20Hz-20KHz), wherein the ratio of the highest to lowest frequencies is 1000:1, such frequency dependence is therefore significant. To eliminate the frequency dependence of the sensor and to normalize the response at high audio frequencies, the output signal from the secondary coils is preferably fed into an amplifier which has a frequency response that is proportional to the reciprocal of frequency. As shown in FIG. 5, one end of the secondary coils is connected through the input resistor 50 to the inverting input of the operational amplifier $O_1$, while the other end of the secondary coils is connected through the resistor 52 to the non-inverting input of the amplifier $O_1$. The non-inverting input of the amplifier is also connected to system ground through resistor 54 and through capacitor 56. A feedback resistor 58 and feedback capacitor 60 are connected in parallel between the output and the inverting input of the amplifier $O_1$ so that the configuration forms an integrating amplifier. In the preferred embodiment resistors 50 and 52 are of equal value ($R_1$), resistors 54 and 58 are of equal value ($R_2$) and the capacitors 56 and 60 are of equal value ($C_1$). Amplifier $O_1$, input resistor 50 and feedback resistor 58 and feedback capacitor 60 form an integrator with a frequency response k, equal to $-1/(2\pi R_1 C_1)$. The output voltage $U_{1x}$ from the amplifier $O_1$ is expressed as:

$$U_{1x} = (V_{out})(-1/(2\pi R_1 C_1 f)) \quad (2)$$

Because $V_{out} = Ef(\mu l I_o)/2\sqrt{2}W)$, the output voltage can be expressed as:

$$U_{1x} = -E\mu l I_o/(4\sqrt{2}W\pi R_1 C_1) \quad (3)$$

The output signal $U_{1x}$ is thus independent of the frequency f. For reasons described hereinafter, the inverted value of the output signal $U_{1x}$ is derived so as to provide the output signal $-U_{1x}$, as represented by the output of inverting amplifier $O_3$, shown connected to receive the output of the amplifier $O_1$.

The four secondary sensor coils 30 in the circuit are connected in series, as previously described. Another benefit resulting from this coil configuration is that the effect of any uniform external magnetic fields passing through the coils of the sensor in the circuit is substantially cancelled. Such magnetic fields can be created, for example, by a nearby transformer or other similar device. These external fields, for example shown by flux line 42 in FIG. 3, can produce stray voltages in the sensor coils, which are manifested in the circuit as undesirable interference signals, often referred to as noise or hum. As a practical matter, the magnitude and intensity of such an external field are considered to be essentially uniform in the vicinity of the circuit of interest. However, with the coils configured in accordance with the present invention, the voltages created across each pair of sensors 30a–30b and 30c–30d (indicated by dotted arrows in FIG. 3) by these external fields will substantially cancel if the two coils 30a and 30b and the two coils 30c and 30d are respectively identically shaped, sized and configured with the same number of turns and disposed one above the other, so that both coils of a set sense the same amount of flux from the external field. Thus, the flux from an external magnetic field passing through coils 30a and 30d (or through coils 30b and 30c) will induce a voltage across the two coils which effectively cancel one another since the two coils, while connected in series, are wound opposite to one another.

In this regard it should be appreciated that in FIG. 4 some flux from conductive strips 32b and 32d will also be sensed by coils 30a and 30b and induce an extraneous error voltage across coils 30a and 30b which will be subtractive from the voltage induced from flux created by the field around conductive strips 32a and 32c. However, because coils 30a and 30b are spaced from the conductive strips 32b and 32d at a greater radial distance than from conductive strips 32a and 32c, the error magnetic field sensed will be substantially less than the magnetic field sensed from conductive strips 32a and 32c. This provides a reason for the preferred ordering of the conductive layers of the board 22 so that the coils 30c and 30d are between the conductive strips 32b and 32d.

The effect of this configuration of sensor coils within an electrical circuit is that current can be accurately determined from the voltages induced in the sensor coils as a result of AC current flow in the circuit, whereas interfering signals resulting from the presence of external electric fields are effectively cancelled.

Thus, in the illustrated embodiment of FIGS. 2A–2D, 3 and 4, there are four current sensors 30a–30d between terminals A and H; however, more or fewer sensor coils can be employed, provided that at least one sensor coil is inductively coupled to at least one conductive strip of each current conductive element 20. For example, if the sensor were not significantly affected by external fields and the signal provided by one sensing coil 30 was adequate (such as, for example, if the connector board were sufficiently shielded), then only one conductive strip 32 and one coil 30 inductively coupled to the strip need be used. Further, under similar circumstances only one current path element 20 need be used with one coil. The sensor can be made more sensitive by, for example, increasing the number of coils and conductive strips which form a conductive element 20 so long as the voltages induced across the coils are additive. The number of sensors and the number of coils and conductive strips per sensor integrally formed in a single multilayer connector board is a function of cost and available height, width and thickness of the connector board. A greater number of coils, for example, can increase the dynamic range and sensitivity of the detection but can also increase the fabrication cost of the board; therefore, optimization may be required.

The device thus described provides a compact, non-intrusive, highly accurate sensor for detecting current, without significantly affecting the impedance of the current flow path, thus insuring a low impedance path of the current through the sensor. The sensor has particular utility in detecting current having signal energy in, and preferably throughout, the audio frequency range. Importantly, the current sensor can be easily fabricated as an integral part of a printed circuit board. Thus, for example, many sensors can be inexpensively incorporated into a single connector board having multiple channels of power amplification of, for example, an emergency warning system. In one such an arrangement eight separate sensors were integrated in a single connector board of a power amplifier for monitoring the current flowing to eight remote locations.

Another benefit of the sensor and current path configuration of the present invention is that interference signals created by error magnetic field voltages induced in neighboring sensors on a board (so-called "cross-talk") can be eliminated. The effect of an interfering signal from any sensor on the output signal of a given sensor can be measured and an appropriate correction signal applied to the output from the given sensor to substantially cancel the interfering signals caused by the other sensors in the board. Although the magnitude of the correction signal must be empirically determined, it is proportional to the frequency of the primary signal and can be determined from the geometry and interspatial relationships of the primary conductive paths and the sensor coils in the board.

Figure 6:
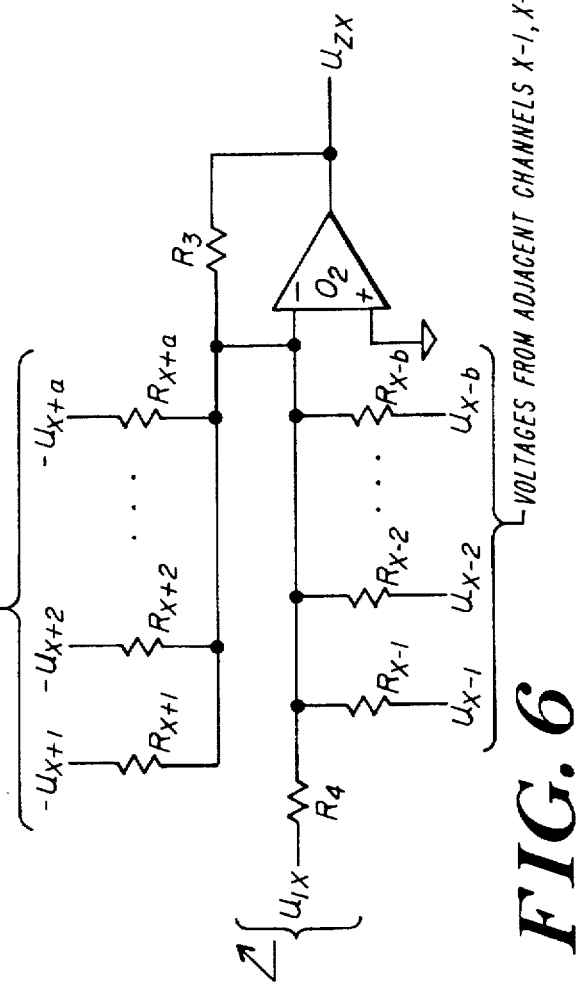
FIG. 6 is a simplified schematic diagram of the circuit of FIG. 5, including additional circuitry for cancelling interfering signals from adjacent sensors.

A preferred signal correction scheme is shown in FIG. 6. $U_{1x}$ is the output voltage (from the operational amplifier of FIG. 5) from a given sensor coil $S_x$. $U_{x+1}, U_{x+2}, \ldots, U_{x+a}$ represent output voltages from respective additional sensors $S_{x+1}, S_{x+2}, \ldots, S_{x+a}$ on one side of the given sensor $S_x$. Output voltages $U_{x-1}, U_{x-2}, \ldots, U_{x-b}$ represent output voltages from respective additional sensors $S_{x-1}, S_{x-2}, \ldots, S_{x-b}$ on the other side of the given sensor $S_x$. The output signal $U_{1x}$ from Equation (3) includes interference, or cross-talk, signals as a result of secondary inductive coupling between the sensors and relatively remote current paths, and can be expressed as:

$$U_{1x} = c[I_{0x} + m_{x-1}I_{0x-1} + \ldots + m_{x-b}I_{0x-b} + \quad (4)$$
$$m_{x+1}I_{0x+1} + \ldots + m_{x+a}I_{0x+a}]$$

where c is a constant equal to $k\mu/2\sqrt{2}W$ (recall that k is equal to $-\frac{1}{2}\pi R_1 C_1$). The output signal from all sensors, $U_{2x}$, is equal to the value of $U_{1x}$ and the sum of all interference signals from all other sensors. This relationship can be expressed as:

$$U_{2x} = -(R_3/R_4)cI_{0x} + (R_3/R_4)cm_{x-1}I_{0x-1} + \ldots + (R_3/R_4)cm_{x-b}I_{0x-b} \quad (5)$$
$$-(R_3/R_4)m_{x+1}I_{0x-1} - \ldots - (R_3/R_4)m_{x+a}I_{0x+a}$$
$$-(R_3/R_{x-1})U_{x-1} - \ldots - (R_3/R_{x-b})U_{x-b}$$
$$+(R_3/R_{x+1})U_{x+1} + \ldots + (R_3/R_{x+a})U_{x+a}.$$

The first and second lines of Equation (5) represent the desired signal and the undesired (i.e., interference) signal components from the sensor $S_x$ at channel x. The third and fourth lines represent the sum of the interference signals from the other sensors $S_{x-1}, \ldots, S_{x-b}$ and $S_{x+1}, \ldots, S_x$ which represent correction signals. The term $m_{x-i}$ is a scale factor for the relative magnitudes of the interference signals from, respectively, channel x–i to channel x. The total number of channels is equal to a +b+1.

By choosing the appropriate resistance values for $R_{x-1}, \ldots, R_{x-b}$ and $R_{x+1}, \ldots, R_{x+a}$ (empirically determined), the individual correction signals can be made equal in magnitude but opposite in polarity to the interference signals $U_{x-1}, \ldots, U_{x-b}$ from sensors on one side of the sensor $S_x$ and the interference signals $U_{x+1}, \ldots, U_{x+a}$ from sensors on the other side of the sensor $S_x$. The result is that the interference signals produced by neighboring sensors on the board are cancelled, leaving only the "true" desired signal sensed by the sensor $S_x$, which is expressed as:

$$U_{2x} = -(R_3/R_4)cI_{0x} \quad (6)$$

As shown in FIG. 6, all output voltages from the frequency compensation circuit of FIG. 5 are fed into the negative input terminal of an operational amplifier $O_2$.

As previously discussed, the coil configuration of the current sensor of the present invention identifies signals from portions of the circuit as having opposite polarities to signals from other portions of the circuit. Thus, any interference signals which are induced in sensor coils 30c and 30d, for example, due to substantially uniform external fields passing through the coils 30a and 30b, and through 30c and 30d, are offset and cancelled by interference signals induced in sensor coils 30a and 30b by those external fields. Thus, as described previously, the output signal $U_{2x}$ from any sensor $S_x$ is proportional to the input signal, is independent of frequency, and contains no extraneous signal components due to substantially uniform external fields or from cross-talk interference from adjacent sensors.

Because certain changes may be made in the above apparatus without departing from the scope of the invention herein disclosed, it is intended that all matter contained in the above description or shown in the accompanying drawings shall be interpreted in an illustrative and not a limiting sense.

What is claimed is:

1. A current sensor for detecting current provided to a load impedance of an electrical circuit without appreciably affecting a signal delivered to said load impedance, the circuit being of the type including a source of electrical power and a current path for conducting current between the power source and the load impedance, wherein the sensor includes:

at least one electrically conductive element, forming a part of said current path, for connecting said power source to the load impedance of the electrical circuit, serving as a primary coil of a transformer circuit;

at least one secondary coil of the transformer circuit, positioned so as to be closely magnetically coupled to said electrically conductive element; and a pair of output terminals coupled to said secondary coil for providing an output signal representative of the current through said load impedance;

wherein the electrically conductive element is a segment of electrically-conductive material coupled in series with the source and the load impedance and constructed so as to minimize the resistance and inductance added by the sensor to said electrical circuit; and wherein said secondary coil and said electrically conductive element are disposed on a multi-layer board including electrically conductive material defining said electrically conductive element and said secondary coil.

2. A current sensor according to claim 1, further including means, coupled between said secondary coil and said output terminals, for generating said output signal substantially independently of frequency.

3. A current sensor for detecting current provided to a load impedance of an electrical circuit without appreciably affecting a signal delivered to said impedance, the circuit being of the type including a source of electrical power and a current path for conducting current between the power source and the load impedance, wherein the sensor includes:

at least one electrically conductive element, forming a part of said current path, for connecting said power source to the load impedance of the electrical circuit, serving as a primary coil of a transformer circuit;

at least one secondary coil of the transformer circuit, positioned so as to be closely magnetically coupled to said electrically conductive element; and a pair of output terminals coupled to said secondary coil for providing an output signal representative of the current through said load impedance;

wherein the electrically conductive element is a segment of electrically-conductive material coupled in series with the source and the load impedance and constructed so as to minimize the resistance and inductance added by the sensor to said electrical circuit;

said current sensor further including at least one other secondary coil positioned so as to be spaced from said electrically conductive element so as to be minimally magnetically coupled to said electrically conductive element, said secondary coils being electrically coupled so as to provide, in response to substantially uniform magnetic flux passing through both said secondary coils, out of phase signal components at said output terminals so that said out of phase signal components substantially cancel one another.

4. A current sensor according to claim 3, wherein said secondary coils and said electrically conductive element are disposed on a multi-layer board including electrically conductive material defining said electrically conductive element and said secondary coils.

5. A current sensor according to claim 3, wherein said at least one other secondary coil is positioned so as to be closely magnetically coupled to at least one other electrically conductive element forming a part of said current path, said one other secondary coil being minimally magnetically coupled to the first mentioned electrically conductive element, wherein the signal components at said output terminals in response to current flowing through said current path are substantially added to one another and said other electrically conductive element is a segment of electrically-conductive material coupled in series with said source and said load impedance and constructed so as to minimize the resistance and inductance added by the sensor to said electrical circuit.

6. A current sensor system for detecting current through a load impedance of an electrical circuit including said load impedance and a current path connected to and from said load impedance, the current sensor system comprising at least one sensor including:

an electrically conductive element electrically coupled in said current path in series with said load impedance;

two coils, one of said coils being positioned so as to be closely magnetically coupled to said electrically conductive element and the other of said coils being positioned so as to be spaced from said electrically conductive element so as to be minimally magnetically coupled to said electrically conductive element; and a pair of output terminals coupled to said coils for providing an output signal representative of the current through said load impedance;

wherein said coils and said electrically conductive element are disposed on a multi-layer board including electrically conductive material defining said part of said electrically conductive element and said coils.

7. A current sensor system according to claim 6, further including a plurality of said sensors wherein said coils and said electrically conductive element of each of said sensors are disposed on said multi-layer board including electrically conductive material defining said electrically conductive element and said coils.

8. A current sensor system according to claim 7, further including means for minimizing or substantially eliminating cross-talk at the output terminals of each of sensors attributed to magnetic fields generated by the electrically conductive elements of the other of said sensors disposed on said multi-layer board.

9. A current sensor for detecting current provided to a load impedance of an electrical circuit without appreciably affecting a signal delivered to said load impedance, the circuit including a source of electrical power and a current path for conducting current between the power source and the load impedance, wherein the sensor includes:

at least one electrically conductive element, forming a part of said current path;

at least one coil of substantially planar geometry, positioned so as to be magnetically coupled to said electrically conductive element; and a pair of output terminals coupled to said coil for providing an output signal representative of the current through said load impedance;

wherein said electrically conductive element is a segment of electrically-conductive material coupled in series with the source and the load impedance and is constructed so as to minimize the resistance and inductance added by the sensor to said electrical circuit.

10. A current sensor according to claim 9, further including means, coupled between said coil and said output terminals, for generating said output signal substantially independently of frequency.

11. A current sensor according to claim 9, wherein said coil and said electrically conductive element are disposed on a multi-layer board including electrically conductive material defining said electrically conductive element and said coil.

12. A current sensor according to claim 9, further including at least one other coil of substantially planar geometry positioned so as to be spaced from and minimally magnetically coupled to said electrically conductive element, said coils being electrically coupled so as to provide, in response to substantially uniform magnetic flux passing through both said coils, out of phase signal components at said output terminals so that said out of phase signal components substantially cancel one another.

13. A current sensor according to claim 12, wherein said coils and said electrically conductive element are disposed on a multi-layer board including electrically conductive material defining said electrically conductive element and said coils.

14. A current sensor according to claim 12, wherein said at least one other coil is positioned so as to be closely magnetically coupled to at least one other electrically conductive element forming a part of said current path, said one other coil being minimally magnetically coupled to the first mentioned electrically conductive element, wherein the signal components at said output terminals in response to current flowing through both electrically conductive elements are substantially added to one another and said other electrically conductive element is a segment of electrically-conductive material coupled in series with said source and said load impedance and is constructed so as to minimize the resistance and inductance added by the sensor to said electrical circuit.

15. A current sensor system for detecting current through a load impedance for an electrical circuit including said load impedance and a current path connected to and from said load impedance, the current sensor system comprising at least one sensor including:

an electrically conductive element electrically coupled in series with said current path and load impedance;

at least two coils, each of a substantially planar geometry, one of said coils being positioned so as to be closely magnetically coupled to said electrically conductive element and the other of said coils being positioned so as to be spaced from said electrically conductive component so as to be minimally magnetically coupled to said electrically conductive element; and a pair of output terminals coupled to said secondary coils for providing an output signal representative of the current through said load impedance;

wherein said coils and said electrically conductive element are disposed on a multi-layer board including electrically conductive material defining said electrically conductive element and said coils.

16. A current sensor system according to claim 15, further including a plurality of said sensors wherein said secondary coils and said electrically conductive element of each of said sensors are disposed on said multi-layer board including electrically conductive material defining said electrically conductive element and said coils.

17. A current sensor system according to claim 16, further including means for minimizing or substantially eliminating cross-talk at the output terminals of each of sensors attributed to magnetic fields generated by the electrically conductive elements of the other of said sensors disposed on said multi-layer board.

* * * * *

UNITED STATES PATENT AND TRADEMARK OFFICE
CERTIFICATE OF CORRECTION

PATENT NO.: 5,736,846

DATED: April 7, 1998

INVENTOR(S): Fred Floru et al.

It is certified that errors appear in the above-identified patent and that said Letters Patent is hereby corrected as shown below:

Claim 6, column 12, line 26, after "said", delete "part of said";

Claim 8, column 12, line 36, before "sensors", insert -- the --; and

Claim 15, column 13, line 30, delete "for" and substitute therefor -- of --.

Signed and Sealed this

Fourth Day of August, 1998

*Attest:*

BRUCE LEHMAN

*Attesting Officer*     *Commissioner of Patents and Trademarks*